US006441670B1

(12) United States Patent
Coughlin, Jr. et al.

(10) Patent No.: US 6,441,670 B1
(45) Date of Patent: Aug. 27, 2002

(54) 5V-TOLERANT RECEIVER FOR LOW VOLTAGE CMOS TECHNOLOGIES

(75) Inventors: Terry C. Coughlin, Jr.; Joseph M. Milewski, both of Endicott, NY (US); Akio Miyoshi, Ohtsuy (JP); Loc Khac Nguyen, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/930,413

(22) Filed: Aug. 15, 2001

(51) Int. Cl.[7] .................................................. H03K 5/08
(52) U.S. Cl. ......................................... 327/323; 326/80
(58) Field of Search ................................ 327/108, 309, 327/312, 316, 318, 323, 327, 328, 333; 326/80, 81

(56) References Cited

U.S. PATENT DOCUMENTS

| | | | | |
|---|---|---|---|---|
| 4,216,390 A | * | 8/1980 | Stewart | 326/68 |
| 5,333,093 A | | 7/1994 | Krautschneider | 361/56 |
| 5,815,354 A | | 9/1998 | Braceras et al. | 361/56 |
| 5,841,619 A | | 11/1998 | Shigehara et al. | 361/111 |
| 5,894,230 A | * | 4/1999 | Voldman | 326/81 |
| 6,049,445 A | | 4/2000 | Gauthier, Jr. et al. | 361/56 |
| 6,144,542 A | | 11/2000 | Ker et al. | 361/111 |
| 6,232,653 B1 | * | 5/2001 | Tanaka et al. | 257/669 |
| 6,232,818 B1 | * | 5/2001 | Zaliznyak | 326/81 |

* cited by examiner

*Primary Examiner*—Kenneth B. Wells
*Assistant Examiner*—Cassandra Cox
(74) *Attorney, Agent, or Firm*—Scully, Scott, Murphy & Presser; William H. Steinberg

(57) ABSTRACT

Receiver circuit providing interface between a legacy system sourcing logic signals including high logic level signals at first voltage levels to semiconductor IC devices operating at second voltage levels, wherein the first voltage levels are greater than the second voltage levels. The receiver circuit comprises: a pass gate device receiving the input voltages including high level logic signals at first logic levels and translating the high logic level signals to an intermediate voltage level for output at a first circuit node, the intermediate voltage level being less than the first voltage level; a first inverter device for receiving the translated voltages at the intermediate voltage levels and inverting the voltages for output at a second circuit node, whereby high input logic level voltages are pulled down at the second node and low input logic level voltages are pulled up at the second node; a circuit element in series with the first inverter device for connecting the first inverter device to a voltage supply source that provides pulled up signals at the second voltage levels in response to low logic level input voltages; and, a circuit responsive to pulled down voltage at the second node for deactivating the first circuit element to thereby prevent leakage current to ground through the first inverter device. Stable switching of voltages is achieved at the second node in a manner that eliminates leakage current between the voltage supply source providing pulled up signals at the second voltage levels and the receiver input.

24 Claims, 2 Drawing Sheets

5V-TOLERANT RECEIVER FOR LOW VOLTAGE CMOS TECHNOLOGIES

BACKGROUND OF THE INVENTION

1. Field of the Invention

This invention relates generally to input/output circuits for integrated circuits, and particularly to a high-voltage tolerant receiver device for protecting low-power semiconductor (e.g., MOS) integrated circuits.

2. Discussion of the Prior Art

Receiving high voltage signals, e.g., 5.0 V in a five volt system, with current semiconductor CMOS integrated circuit receiver devices presents several problems to the IC designer. Over-voltage stress at the receiver input may result in damage ranging from performance degradation to catastrophic failure. Typically, care must be taken to prevent device latch-up, hot-electron performance degradation, gate-oxide breakdown, ESD damage; and, in the case of IC devices including PFETs, P-N diode reverse bias breakdown.

FIG. 1 illustrates an example high-voltage protected interface circuit 10 according to the prior art. This circuit is designed to receive 5V signals at an input "PAD" 12 associated with the circuit implementing 2.5V CMOS technology, for example. As shown in FIG. 1, the NFET device N1 14 is a thick oxide device that is capable of handling the maximum voltage that is safely allowed in the 2.5V CMOS technology.

Devices N1 and devices P1 16*a* and N2 16*b* forming a first inverter structure 15 are powered off a 3.3 V voltage supply, and provide an intermediate voltage allowing for a wider receiver threshold range for 5V high logic level signals at the input PAD. Devices P2 46*a* and N2 46*b* form a second inverter device 45 that is powered off the IC core voltage which may be 3.3 V, or when the technology permits, 2.5V as shown in FIG. 1. It is understood that the IC core voltage may be as low as 1.8 VDC as the technology permits. The second inverter 45 performs the necessary level translation (i.e., voltage pull-up or pull-down) of the input signal and maintains the non-inverting polarity of the data received.

The high voltage protection provided by the circuit shown in FIG. 1 is maintained by NFET device N1 14. This NFET is configured as a pass gate that limits the voltage at node NA 13 to one threshold voltage "Vt" below the gate voltage at node G1. Node G1 is tied to the 3.3V power supply which limits the voltage at node NA 13 to (3.3 V−Vt) volts when the PAD voltage rises above 3.3 volts. The signal at node NB 17 switches between 0V and 3.3V and the signal 48 at the output swings between 0V and 2.5V. The problem with this type of design is the effect the voltage at node NA 13 has on inverter devices P1 16*a* and N2 16*b*. Because the voltage at node NA 13 is limited to (3.3 V−Vt), the voltage on the gate of P1 16*a* is never going to be high enough to completely cut off current flow through P1. When the voltage at PAD input 12 is at a high logic level in the 5V system, node NA 13 will be sitting at (3.3V−Vt). NFET N2 16*b* will be turned on and conducting current to pull down the voltage at node NB 17. The PFET P1 16*a* will not be completely turned off thereby allowing a leakage current to flow from the 3.3V supply through devices P1 16*a* and N2 16*b* continuing to circuit ground 18. It should be understood that the amount of current will vary with process temperature and voltage. This unwanted power consumption defeats the purpose of using a low power CMOS technology, which is to reduce power consumption.

Circuits have been designed and used in the industry to address this problem. The circuit 20 shown in FIG. 2 corresponds to the circuit 10 of FIG. 1 but has been modified to include one additional PFET transistor device P3 22. This PFET device P3 22 utilizes feedback from the output of first inverter 15 at node NB 17 to pull up the voltage at node NA to 3.3V when receiving 5V signals at input PAD 12. As such, PFET device P3 22 is also known as a "keeper", "pull-up" or "boot strap" device. When PAD input 12 is at a high level and the voltage at node NA. 13 is at (3.3 V−Vt), the output of the inverter 15 formed by devices P1 16*a* and N2 16*b* is low. A low level on the gate of device P3 22 causes device P3 to turn on and conduct current between 3.3V and node NA 13. This causes the voltage at node NA 13 to rise to 3.3V which now turns off PFET P1 16*a* that was partially on. This solves the original problem of leakage or quiescent power-consumption, but causes a host of additional problems for some interfaces.

For instance, the added PFET device P3 22 in the circuit 20 of FIG. 2 introduces a path 23 for current between the PAD input 12 and the 3.3V power supply used to power pull-up device P3 22. When PAD input voltage 12 switches from high to low and the voltage at node NB 17 switches from low to high, there exists a range of input voltages where PFET device P3 is conducting. This situation requires a stronger external signal to drive PAD 12 to overcome the current path through transistor device P3 22. Another problem with the circuit in FIG. 2 occurs when external pull-up or pull-down devices are used. For example, the resistor R1 24 in FIG. 2 represents a pull-down device used to keep the PAD voltage at a valid logic level (e.g., low) when the PAD input is not being driven. The resistor R1 must be low enough in impedance to overpower device P3 to guarantee a zero level at the PAD. This puts a size limitation on the pull-down resistor R1 which is greater than the limitation set by the leakage current of the technology. A weak source driving the PAD input 12 may also cause the receiver to hang-up at mid-rail when device P3 22 is conducting. The turning on and off of transistor device P3 22 during a PAD transition also causes the input impedance of the receiver to become nonlinear. This nonlinear receiver front end can have an adverse effect on signal integrity.

While a solution may be to implement the circuits in FIGS. 1 and 2 by specifying or placing restrictions on the power supply ranges and pull-down resistors in order to bound the negative aspects of power consumption and leakage by some specified amount, this just limits the problem and does not provide a total solution that eliminates the problem.

It would be highly desirable to provide a receiver circuit for a semiconductor device that eliminates the aforementioned power dissipation problems of excess leakage current and the requirement for higher input drive at the input.

SUMMARY OF THE INVENTION

It is an object of the present invention to provide a receiver circuit for a semiconductor device that eliminates prior art receive device deficiencies such as power dissipation problems of excess leakage current and the requirement for higher input drive at the input.

According to the principles of the invention, there is provided a receiver circuit for interfacing a legacy system sourcing logic signals including high logic level signals at first voltage levels to semiconductor integrated circuit devices operating at second voltage levels, wherein the first voltage levels are greater than the second voltage levels. The receiver circuit comprises: a pass gate device receiving the input voltages including high level logic signals at first logic levels and translating the high logic level signals to an intermediate voltage level for output at a first circuit node, the intermediate voltage level being less than the first voltage level; a first inverter device for receiving the translated voltages at the intermediate voltage levels and inverting the voltages for output at a second circuit node, whereby high input logic level voltages are pulled down at the second node and low input logic level voltages are pulled up at the second node; a circuit element in series with the first inverter device for connecting the first inverter device to a voltage supply source that provides pulled up signals at the second voltage levels in response to low logic level input voltages; and, a circuit responsive to pulled down voltage at the second node for deactivating the first circuit element to thereby prevent leakage current to ground through the first inverter device, and responsive to pulled up voltage at the second node for enabling activation of the circuit element to facilitate pulling up voltage at the second node, Advantageously, stable switching voltages is achieved at said second node in a manner that eliminates leakage current between the voltage supply source providing pulled up signals at the second voltage levels and the receiver input.

BRIEF DESCRIPTION OF THE DRAWINGS

Further features, aspects and advantages of the apparatus and methods of the present invention will become better understood with regard to the following description, appended claims, and the accompanying drawings where:

DETAILED DESCRIPTION OF THE PREFERRED EMBODIMENTS

Figure 3:
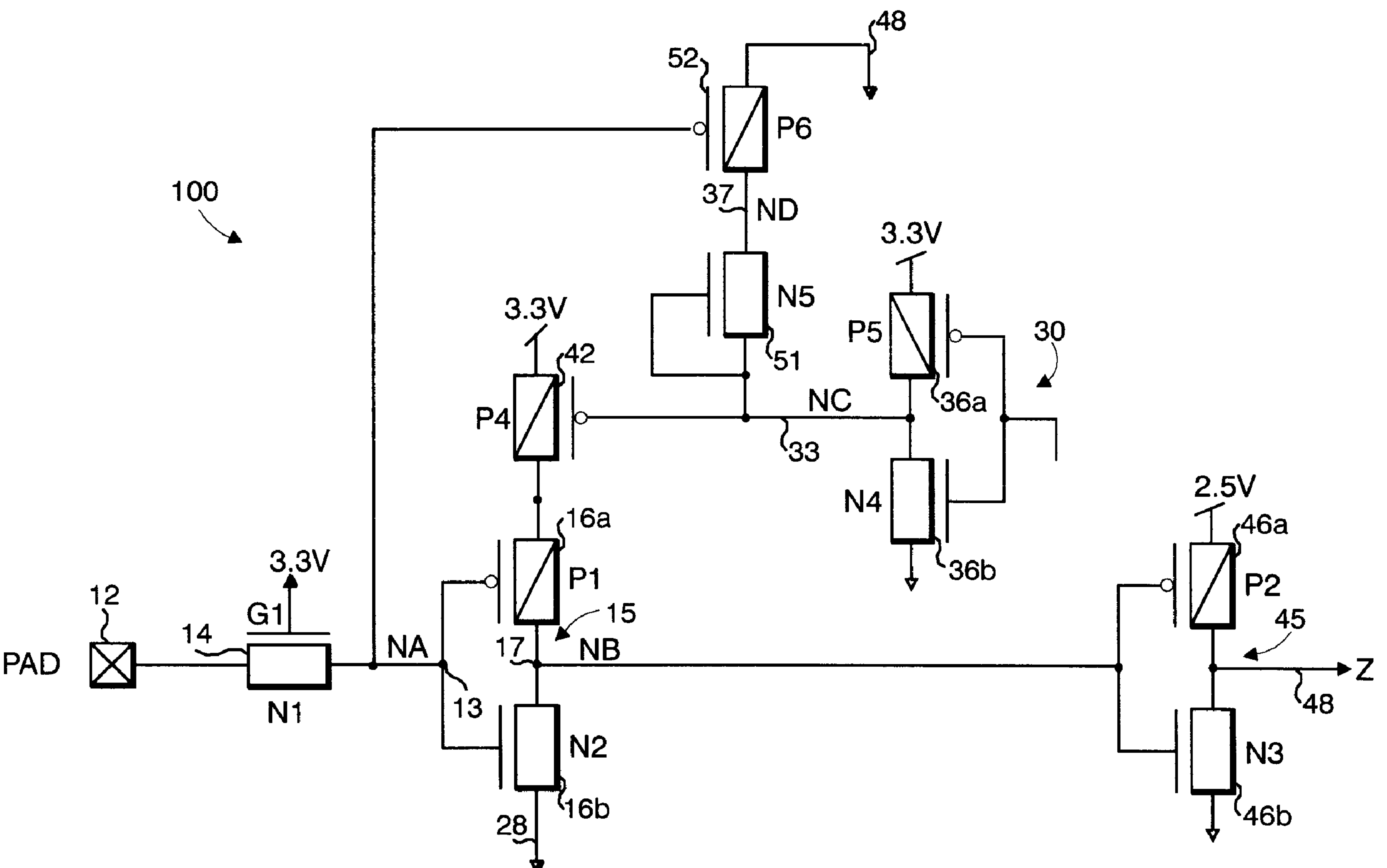
FIG. 3 illustrates the receiver circuit 100 of the invention which is a design that eliminates the provision of the keeper device provided in the prior art.

FIG. 3 illustrates the receiver device 100 of the invention which is a design that eliminates the provision of PFET transistor device P3 and includes additional devices P4-P6 and N4-N5. As mentioned, a high logic level at the input PAD initially results in a voltage of (3.3V−Vt) at node NA 13 and consequently the voltage at node NB 17 is pulled low by transistor N2 16*b* of the inverter 15. The low level voltage at node NB 17 results in a high logic level at node NC 33 which is an output of a third inverter structure 30 formed by the combination of transistor devices P5 36*a* and N4 36*b* receiving the voltage at node NB 17. As shown in FIG. 3, the voltage signal level of node NC 33 forms a gate input of a PFET device P4 42 which is connected in series with first inverter structure 15 between the power supply voltage 3.3 V and ground 28. Particularly, a high logic voltage level at node NC 33 functions to turn off the PFET device P4 42 preventing any current leakage current from 3.3V to ground through transistor devices P4 42, P1 16*a* and N2 16*b*. As shown in FIG. 3, the power supply voltage of 3.3 V used to power device P4 42 and inverter devices 15, 30 is permitted when the receiver 100 is interfacing with a 5V legacy system, however, it should be understood that device P4 42 and inverter devices 15, 30 may be powered by a 2.5 V supply source when the receiver 100 is interfacing with a 3.3 V legacy system. As further shown in FIG. 3, it is understood that the voltage at node NC 33 remains at a high logic level because the series connection of transistors N5 51 and P6 52 connected at node NC 33 do not provide a path to ground 48 from node NC. That is, transistor devices N5 51 and P6 52 are not conducing due to a high voltage at node NA 13 (e.g., 3.3V−Vt) that is input to the gate of PFET device P6 52. The PFET device P6 52 will remain completely off as long as the gate input of P6 is at a voltage equivalent to 3.3V−Vt due to the provision of series transistor N5, e.g., NFET 51 which provides an identical voltage of 3.3V−Vt input to a terminal of P6. The NFET device N5 51 thus functions as a matching device to pass-gate N1 14, and provides the same voltage drop across N5 as gate N1 when passing a high voltage. The voltage at node ND 37 formed at the common connection of devices N5 51 and P6 52 is at a voltage level equivalent to one threshold voltage below the voltage at node NC 33 when the voltage at node NC is high. Under this condition, the voltage at node ND (3.3−Vt) will always be equal or less than the gate of P6 (3.3V−Vt), which guaranties that PFET device P6 remain completely off.

When the voltage at input PAD 12 switches from high to low, the NFET device N2 of first inverter 15 stops conducting and prevents NFET device N2 16*b* from pulling down the voltage at node NB 17. At the same time, a low voltage level at node NA 13 turns on PFET device P6 52. If the voltage at node NC 33 is still at a high level, NFET device P6 52 will start to pull the voltage at node NC 33 down through device N5 51. When the voltage at node NC 33 starts to fall low, PFET device P4 42 pulls up the voltage at node NB 17 through PFET device P1 16*a*. A high level at node NB 17 thus causes the voltage at node NC 22 to be driven lower through the third inverter structure 30 formed by transistor devices P5 36*a* and N4 36*b*. This positive feedback creates stable voltage levels at nodes NB 17 and NC 33.

Figure 1:
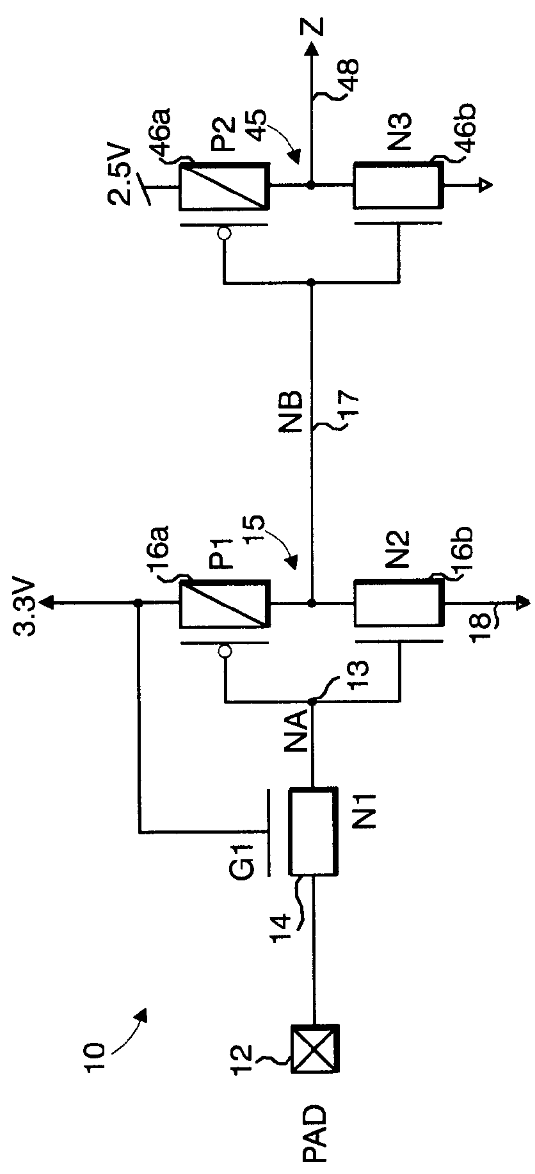
FIG. 1 illustrates an example high-voltage protected interface circuit 10 according to the prior art.
Figure 2:
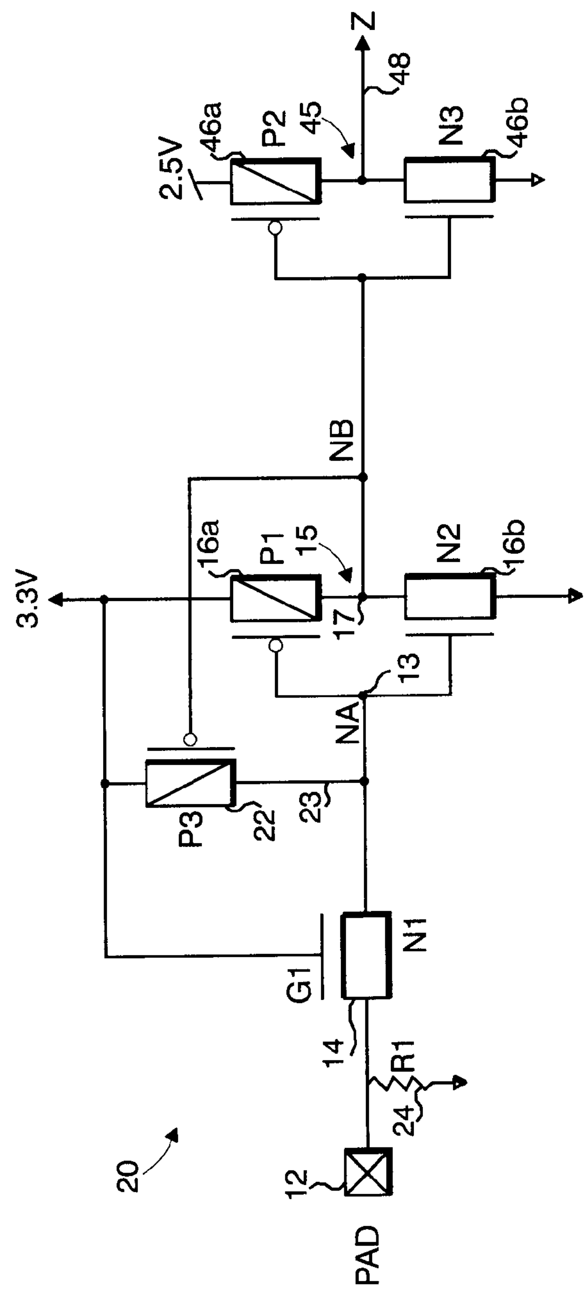
FIG. 2 illustrates a prior art receiver circuit 20 corresponding to the circuit 10 of FIG. 1 but modified to include a keeper device.

The receiver circuit 100 of FIG. 3 provides the same level of voltage protection as the circuits in FIGS. 1 and 2 without consuming any DC power or providing a leakage path between the input PAD 12 and the power supply voltage whether it be 3.3V supply or 2.5 V supply. It should be understood that the disclosed invention is not limited to the power supply ranges used to illustrate the function, but may be used with many combinations of power supplies that are compatible with the circuit technology and I/O interface specifications.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A receiver circuit for a semiconductor integrated circuit device comprising:

- a pass gate device having a first input for receiving input logic voltages, a gate input connected to a first voltage supply source operating at a first voltage level, and an output connected to a first node, said pass gate passing a received high logic level input voltage to said first node and providing high voltage protection for said receiver by limiting the voltage passed to said first node;
- a first inverter device having a connection to a second voltage supply source, a connection to ground, and an output defining a second node, said first inverter device for receiving said input voltage and pulling down said input voltage for output at said second node when said input voltage is high, and pulling up said input voltage to said limited voltage level for output at said second node when said input voltage switches to a low voltage;

a first transistor device for connecting said first inverter device to said second voltage supply source;

a positive feedback circuit responsive to said pulled down voltage at said second node for turning off said first transistor device to thereby prevent leakage current to ground through said first inverter device, and enabling activation of said transistor device to facilitate pulling up voltage at said second node via said inverter device, wherein stable switching voltages is achieved at said second node in a manner that eliminates leakage current between said second voltage supply source and a receiver input.

2. The receiver circuit for a semiconductor integrated circuit as claimed in claim 1, wherein said positive feedback circuit includes a second inverter device having a connection to said second voltage supply source, a connection to ground, and an output defining a third node for connection to a control terminal of said first transistor device, said second inverter device for receiving voltage at said second node and pulling up said voltage for output at said third node when said voltage at said second node is pulled down, said pulled up voltage at said third node functioning to turn off said first transistor device and prevent said leakage current to ground through said first inverter device.

3. The receiver circuit for a semiconductor integrated circuit as claimed in claim 2, wherein said second inverter device receives pulled-up voltage at said second node when an input voltage changes from high to low logic level, and pulls down said voltage for output at said third node when said voltage at said second node is pulled up, said pulled down voltage at said third node functioning to activate said first transistor device and further aid in pulling up said voltage at said second node in response to switched input voltage to thereby achieve voltage stability at said second node.

4. The receiver circuit for a semiconductor integrated circuit as claimed in claim 3, wherein said feedback path further includes a second transistor device providing path from said third node to ground, said second transistor device having control input for receiving a voltage at said first node, said second transistor device being de-activated to maintain said pulled up voltage at said third node in response to a high input voltage at said first node, whereby voltage stability at said third node is achieved.

5. The receiver circuit for a semiconductor integrated circuit as claimed in claim 4, wherein said second transistor device is activated to facilitate pulling down said voltage at said third node in response to switched input voltage from high to low at said first node.

6. The receiver circuit for a semiconductor integrated circuit as claimed in claim 4, wherein said second transistor device includes circuit means for ensuring said second transistor device is completely turned off in order to maintain said pulled up voltage at said third node in response to a high input voltage at said first node.

7. The receiver circuit for a semiconductor integrated circuit as claimed in claim 6, wherein said circuit means includes second pass gate device having a terminal connecting said third node and a common connection to a terminal of said second transistor device at a fourth node of said receiver circuit, said second pass gate device ensuring that the voltage at said fourth node is less than or equal to voltage at said control input of said second transistor device when receiving a high input voltage.

8. The receiver circuit for a semiconductor integrated circuit as claimed in claim 7, wherein second pass gate device is a transistor device configured to provide a voltage drop equivalent to an amount of a transistor device threshold voltage between said third and fourth nodes.

9. The receiver circuit for a semiconductor integrated circuit as claimed in claim 8, wherein a voltage level of said second voltage supply source is equal or less than a voltage level of said first voltage supply source.

10. A method for preventing current leakage in a semiconductor integrated circuit device for receiving high voltage input signals, comprising:

a) providing a pass gate device having a first input for receiving input logic voltages, a gate input connected to a first voltage supply source, and an output connected to a first node, said pass gate passing the received input voltage to said first node and providing high voltage protection for said receiver by limiting a high voltage passed to said first node;

b) providing a first inverter device having a connection to a second voltage supply source, a connection to ground, and an output defining a second node, for pulling down said input voltage for output at said second node when said input voltage is high, and pulling up said input voltage to said limited voltage level for output at said second node when said input voltage switches to a low voltage;

c) providing a first transistor device for connecting said first inverter device to said second voltage supply source; and, d) responding to said pulled down voltage at said second node for turning off said first transistor device for preventing leakage current to ground through said first inverter device, and enabling activation of said first transistor device to facilitate pulling up voltage at said second node via said inverter device when said input voltage transitions from low to high, wherein stable switching voltages is achieved at said second node in a manner that eliminates leakage current between said second voltage supply source and a receiver input.

11. The method as claimed in claim 10, further including the steps of:

providing a second inverter device having a connection to said second voltage supply source, a connection to ground, and an output defining a third node for connection to a control terminal of said first transistor device; and, pulling up said voltage for output at said third node in response to pulled down voltage at said second node, said pulling up voltage enabling said first transistor device to turn-off and prevent said leakage current to ground through said first inverter device.

12. The method as claimed in claim 11, further including pulling down said voltage for output at said third node in response to pulled up voltage at said second node, said pulling down voltage enabling activation of said first transistor device to facilitate pulling up said voltage at said second node.

13. The method as claimed in claim 12, further including the steps of:

providing a second transistor device having a connection to ground, a connection to said third node, and having control input for receiving a voltage at said first node; and, de-activating said second transistor device for maintaining said pulled up voltage at said third node in response to a high input voltage at said first node.

14. The method as claimed in claim 13, further including:

activating said second transistor device in response to switched input voltage from high to low at said first node, said activating enabling pulling down of said voltage at said third node during said high to low voltage switching at said first node.

15. The method as claimed in claim 13, further including:

ensuring said second transistor device is completely turned off in order to maintain said pulled up voltage at said third node in response to a high input voltage at said first node.

16. The method as claimed in claim 15, further including:

providing second pass gate device having a terminal connecting said third node and a common connection with a terminal of said second transistor device at a fourth node of said receiver circuit, said second pass gate device providing voltage drop between said third and fourth nodes to ensure that the voltage at said fourth node is equal to or less than said voltage at said control input of said second transistor device when receiving a high voltage.

17. The method as claimed in claim 16, wherein said second pass gate device is a transistor device configured to provide a voltage drop equivalent to an amount of a transistor device threshold voltage between said third and fourth nodes.

18. A receiver circuit for interfacing a legacy system sourcing logic signals including high logic level signals at first voltage levels to semiconductor integrated circuit devices operating at second voltage levels, wherein the first voltage levels are greater than the second voltage levels, said receiver circuit comprising:

a pass gate device receiving said input voltages including high level logic signals at first logic levels and translating said high logic level signals to an intermediate voltage level for output at a first circuit node, said intermediate voltage level being less than said first voltage level;

a first inverter device for receiving said translated voltages at said intermediate voltage levels and inverting said voltages for output at a second circuit node, whereby high input logic level voltages are pulled down at said second node and low input logic level voltages are pulled up at said second node;

a circuit element in series with said first inverter device for connecting said first inverter device to a voltage supply source that provides pulled up signals at said second voltage levels in response to low logic level input voltages; and, circuit means responsive to pulled down voltage at said second node for deactivating said first circuit element to thereby prevent leakage current to ground through said first inverter device, and responsive to pulled up voltage at said second node for enabling activation of said circuit element to facilitate pulling up voltage at said second node, wherein stable switching voltages is achieved at said second node in a manner that eliminates leakage current between the voltage supply source providing pulled up signals at said second voltage levels and the receiver input.

19. The receiver circuit as claimed in claim 18, wherein said second voltage level is equal to or less than said intermediate voltage level.

20. The receiver circuit as claimed in claim 19, wherein said first circuit element includes a transistor device, said circuit means comprising:

second inverter circuit for inverting said pulled down voltage at said second circuit node and defining a third circuit node for connection with a gate of said transistor device, wherein said inverted pulled down voltage at said third node enables said transistor device to turn off to thereby prevent leakage current to ground through said first inverter device.

21. The receiver circuit as claimed in claim 20, wherein said circuit means includes a circuit element responsive to said translated voltage at said intermediate voltage level for ensuring voltage stability of said inverted pulled down voltage at said third node.

22. A method for preventing leakage current in a receiver circuit providing interface between a legacy system sourcing logic signals including high logic level signals at first voltage levels to semiconductor integrated circuit devices operating at second voltage levels, wherein the first voltage levels are greater than the second voltage levels, said method comprising the steps of:

a) receiving said input voltages including high level logic signals at first logic levels and translating said high logic level signals to an intermediate voltage level for output at a first circuit node, said intermediate voltage level being less than said first voltage level;

b) receiving said translated voltages at said intermediate voltage level and inverting said voltages for output at a second circuit node, whereby high input logic level voltages are pulled down at said second node and low input logic level voltages are pulled up at said second node;

c) providing a circuit element device in series with said first inverter device for connecting said first inverter device to a voltage supply source providing pulled up signals at said second voltage levels;

d) responding to pulled down voltage at said second node for deactivating said first circuit element to thereby prevent leakage current to ground through said first inverter device, and responding to pulled up voltage at said second node for enabling activation of said first circuit element to facilitate pulling up voltage at said second node, wherein stable switching voltages is achieved at said second node in a manner that eliminates leakage current between the voltage supply source and the receiver input.

23. The method as claimed in claim 22, wherein said step d) of responding to pulled down voltage at said second node for deactivating said first circuit element includes the step of inverting said pulled down voltage for output at a third circuit node, wherein said inverted pulled down voltage enables said circuit element to turn off to thereby prevent leakage current to ground through said first inverter device.

24. The method as claimed in claim 23, further including the step of:

responding to said translated voltage at said intermediate voltage level for ensuring voltage stability of said inverted pulled down voltage at said third node.

* * * * *